United States Patent
Grossi et al.

(10) Patent No.: US 10,839,902 B2
(45) Date of Patent: Nov. 17, 2020

(54) METHOD FOR PROGRAMMING A RESISTIVE MEMORY

(71) Applicant: COMMISSARIAT A L'ENERGIE ATOMIQUE ET AUX ENERGIES ALTERNATIVES, Paris (FR)

(72) Inventors: Alessandro Grossi, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/395,757

(22) Filed: Apr. 26, 2019

(65) Prior Publication Data
US 2019/0333579 A1 Oct. 31, 2019

(30) Foreign Application Priority Data
Apr. 27, 2018 (FR) .................... 18 53710

(51) Int. Cl.
*G11C 13/00* (2006.01)

(52) U.S. Cl.
CPC ...... *G11C 13/0069* (2013.01); *G11C 13/0007* (2013.01); *G11C 13/0011* (2013.01); *G11C 13/0097* (2013.01); *G11C 2213/32* (2013.01)

(58) Field of Classification Search
CPC .......... G11C 13/0069; G11C 13/0097; G11C 13/0011; G11C 13/0007; G11C 2213/32; G11C 2013/009; G11C 2013/0083
See application file for complete search history.

(56) References Cited

U.S. PATENT DOCUMENTS

| | | | |
|---|---|---|---|
| 2010/0072459 A1* | 3/2010 | Bertin .................. | G11C 29/021 257/24 |
| 2013/0258753 A1 | 10/2013 | Gopinath et al. | |
| 2014/0226388 A1 | 8/2014 | Khoueir et al. | |
| 2014/0245108 A1 | 8/2014 | Gaertner et al. | |
| 2016/0240252 A1* | 8/2016 | Oh .................... | G11C 13/0069 |
| 2017/0345499 A1* | 11/2017 | Sills ................... | G11C 11/5685 |

OTHER PUBLICATIONS

Search Report and Written Opinion as issued in French Patent Application No. 1853710, dated Jan. 30, 2019.
Belmonte, A., et al., "Optimization of the Write Algorithm at Low-Current (10µA) in $Cu/Al_2O_3$-based Conductive-Bridge RAM," IEEE, 2015, pp. 114-117.

* cited by examiner

*Primary Examiner* — David Lam
(74) *Attorney, Agent, or Firm* — Pillsbury Winthrop Shaw Pittman LLP

(57) ABSTRACT

A method for programming a non-volatile resistive memory including a plurality of non-volatile resistive memory cells, each memory cell being able to switch in a reversible manner between a low resistance state in which the memory cell has an electrical resistance value lower than a first resistance threshold; and a high resistance state in which the memory cell has an electrical resistance value greater than the first resistance threshold; the programming method including determining the first resistance threshold carried out periodically during the lifetime of the resistive memory.

8 Claims, 3 Drawing Sheets

METHOD FOR PROGRAMMING A RESISTIVE MEMORY

CROSS REFERENCE TO RELATED APPLICATIONS

This application claims priority to French Patent Application No. 1853710, filed Apr. 27, 2018, the entire content of which is incorporated herein by reference in its entirety.

FIELD

The present invention is relative to the field of resistive random access memories, also known as RRAMs. The present invention more specifically relates to a method for programming such a resistive memory.

BACKGROUND

Resistive memories are non-volatile memories having a high operating speed, a low electrical energy consumption and a long lifetime. For these reasons, resistive memories are promising candidates for replacing both current random access memories and non-volatile memories such as Flash type memories.

Several resistive memory technologies exist. CBRAMs (Conductive Bridging Random Access Memories), or OxRAMs (Oxide based Random Access Memories) may notably be cited.

A resistive memory is composed of a multitude of resistive memory cells arranged in lines and columns so as to form a matrix. The memory cell comprises a dielectric material arranged between two conductive electrodes. The dielectric material is capable of switching in a reversible manner between a high resistance state and a low resistance state. These two resistance states thus make it possible to store an information bit in each memory cell.

The change of resistance state is linked to the formation and to the rupture, in the dielectric material, of a switching zone, which forms a conductive path electrically connecting the electrodes of the memory cell. The nature of this conductive path depends on the technology used. For example, in CBRAM type memories, the conductive path is a filament formed by metal ions, and in OxRAM type memories, the formation of the conductive path is attributed to the accumulation of oxygen vacancies within the oxide layer.

Whatever the case, the conduction mechanisms that intervene in resistive memory cells imply great variability of the resistance values that the memory cells can take. FIG. 1 schematically represents the distributions of the resistance values of a resistive memory cell in the low resistance state 101 and in the high resistance state 102. FIG. 1 also shows the influence of the ageing of the memory cell on these distributions. Initially, the distributions of the resistance values (represented in dotted lines) are spaced apart from each other. With the ageing of the memory cell, the distributions of the resistance values (represented in solid lines) have a tendency to widen and to come closer to one another, which may lead to the appearance of an overlap zone.

Furthermore, to programme a memory cell, a programming voltage is applied between the electrodes of the memory cell. It may be a writing voltage to write the memory cell, that is to say place it in the low resistance state, or an erasing voltage to erase the memory cell, that is to say place it in the high resistance state.

However, after such a programming operation, it may happen that the memory cell does not pass to the desired resistance state. For this reason, it is verified that the memory cell is correctly programmed by comparing its resistance value with a predefined resistance threshold. If the result of this comparison is negative, this signifies that the programming operation has not worked. In this case, the programming operation is repeated a certain number of times until the memory cell takes the desired resistance state or until a maximum number of attempts is reached.

In general, a first resistance threshold used to read the memory cell, a second resistance threshold used when the memory cell is writing programmed and a third resistance threshold used when the memory cell is erasing programmed are defined. The third resistance threshold is greater than the second resistance threshold and their difference defines the programming window of the memory cell. The first resistance threshold may then be chosen in the middle of the programming window.

A drawback of this programming method is that the different resistance thresholds are fixed throughout the lifetime of the resistive memory whereas the distributions of the resistance values widen. Consequently, with the ageing of the memory, the programming of the memory cells fails more and more often, which increases the number of attempts necessary to succeed in placing the memory cells in the desired resistance state. The result is an increase in the programming time of the resistive memory.

SUMMARY

It results from the above that there exists a need to improve the programming of a resistive memory by defining a resistance threshold that varies during the lifetime of the resistive memory in order to minimise programming errors.

An aspect of the present invention aims to respond to this need by proposing a method for programming a non-volatile resistive memory comprising a plurality of non-volatile resistive memory cells, each memory cell being able to switch in a reversible manner between:
  a first programming state, called "low resistance state", in which the memory cell has an electrical resistance value lower than a first resistance threshold; and
  a second programming state, called "high resistance state", in which the memory cell has an electrical resistance value greater than the first resistance threshold;
the programming method comprising a step of determining the first resistance threshold carried out periodically, the determination step comprising:
  a first writing step intended to place a first group of memory cells in the low resistance state, a first number of memory cells of the first group not actually being placed in the low resistance state after the first programming step; and
  a second erasing step intended to place a second group of memory cells in the high resistance state, a second number of memory cells of the second group not actually being placed in the high resistance state after the second programming step;
the first resistance threshold being determined so as to minimise a number of programming errors equal to the sum of the first number of memory cells and the second number of memory cells.

Thanks to the invention, the first resistance threshold is regularly adapted as a function of the ageing of the resistive memory, which makes it possible to reduce the error rate caused by the widening of the distributions of the resistance values that the memory cells can take. The number of attempts necessary to place a memory cell in a given resistance state is also reduced which leads to a decrease in the programming time.

The method according to embodiments of the invention may also comprise one or more characteristics among the following considered individually or according to all technically possible combinations thereof.

According to an embodiment, the step of determining the first resistance threshold comprises the following steps:
a) defining a variable resistance threshold equal to the first resistance threshold determined during of the preceding determination step;
b) carrying out the first writing step and the second erasing step using the variable resistance threshold;
c) determining the number of programming errors arising during step b);
d) repeating steps b) and c) after having modified the variable resistance threshold according to a predetermined sense of variation, steps b) and c) being repeated at least once and as long as the number of programming errors decreases between two consecutive steps b);
e) defining the first resistance threshold equal to the variable resistance threshold used during the penultimate step b).

According to an embodiment, two consecutive steps of determining the first resistance threshold are separated by a time interval corresponding to a first predetermined number of programming cycles that at least one memory cell has undergone.

According to an embodiment, the programming method comprises a programming step comprising at least one of the following steps:
a writing step intended to place at least one memory cell in the low resistance state, the at least one memory cell being considered as being in the low resistance state at the end of the writing step if the resistance value of the at least one memory cell is lower than a second resistance threshold lower than or equal to the first resistance threshold;
an erasing step intended to place at least one memory cell in the high resistance state, the at least one memory cell being considered as being in the high resistance state at the end of the erasing step if the resistance value of the at least one memory cell is greater than a third resistance threshold greater than or equal to the first resistance threshold;
the second resistance threshold and the third resistance threshold being defined as a function of the determined first resistance threshold.

According to an embodiment, the second resistance threshold and the third resistance threshold are equal to the first resistance threshold.

According to an embodiment, the second resistance threshold and the third resistance threshold are respectively equal to 90% and to 110% of the first resistance threshold.

According to an embodiment, each memory cell comprises a dielectric material arranged between two electrodes, the memory cell passing from the high resistance state to the low resistance state when a switching zone is formed in the dielectric material, the switching zone electrically connecting the electrodes of the memory cell, the programming method further comprising a step of initialisation of the resistive memory comprising the following steps:
forming for the first time the switching zone of each memory cell; and
conditioning the memory cells by repeating a second predetermined number of programming cycles each comprising an operation of writing and an operation of erasing the memory cells.

According to an embodiment, the memory cells are of CBRAM or OxRAM type.

BRIEF DESCRIPTION OF THE FIGURES

The invention and its different applications will be better understood on reading the description that follows and by examining the figures that accompany it, among which.

The figures are only presented for indicative purposes and in no way limit the invention.

For greater clarity, identical or similar elements are marked by identical reference signs in all of the figures.

DETAILED DESCRIPTION

Figure 1:
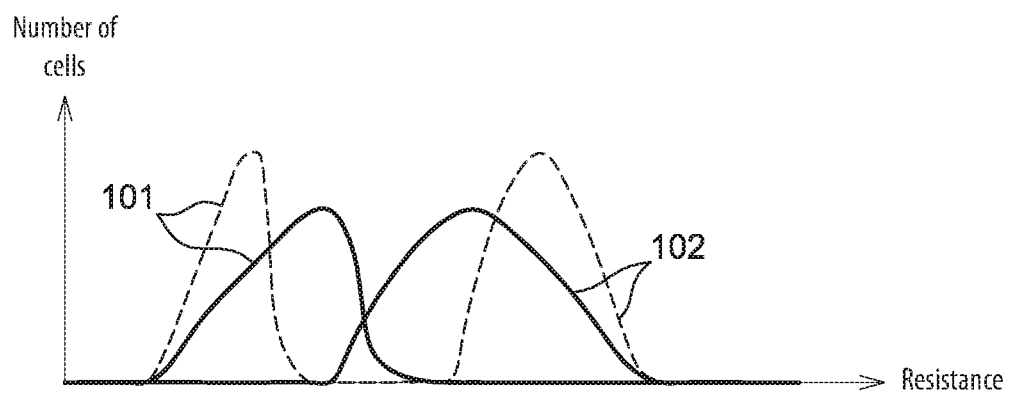
FIG. 1 represents distributions of a resistive memory cell in the low resistance state and in the high resistance state.
Figure 2:
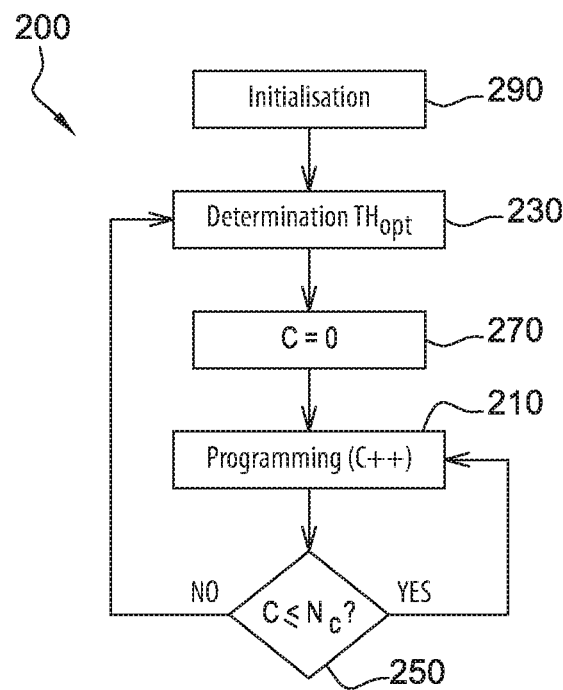
FIG. 2 is a logic diagram of an embodiment of the programming method according to an embodiment of the invention.

FIG. 2 shows a method for programming 200 a non-volatile resistive memory, according to an embodiment of the invention. The resistive memory comprises a plurality of resistive memory cells arranged in lines and in columns so as to form a matrix. Each memory cell comprises a first electrode, a second electrode and a layer of a dielectric material arranged between the first electrode and the second electrode.

The memory cells are for example conductive bridge random access memory (CBRAM) cells or oxide-based random access memory (OxRAM) cells.

The electrodes are electrically conductive layers and may be formed from one or more conductive materials such as titanium, titanium nitride, doped silicon, tungsten, tungsten nitride, metal silicides, platinum. The electrodes have a thickness comprised, in an embodiment, between 5 nm and 30 nm.

The dielectric material may be an oxide of a transition metal such as hafnium oxide, tantalum oxide, titanium oxide, nickel oxide, tungsten oxide or zinc oxide. The dielectric material may also be silicon oxide, aluminium oxide, indium oxide or gadolinium oxide. Optionally, the layer of dielectric material may comprise several superimposed sub-layers. The layer of dielectric material has a thickness comprised, in an embodiment, between 3 nm and 20 nm, and for example comprised between 5 nm and 10 nm.

The dielectric material, and in a more general manner the memory cell, can switch in a reversible manner between a low resistance state and a high resistance state. These two resistance states thus enable the memory cell to store binary information.

The memory cell may be subjected to a writing operation, to an erasing operation or to a reading operation. These are the three elementary operations on which the operation of the memory cell is based.

The writing operation is a first operation of programming the memory cell during which a writing voltage is applied between the electrodes of the memory cell. The writing voltage is provided to place the memory cell in the low resistance state.

The erasing operation is a second operation of programming the memory cell during which an erasing voltage is applied between the electrodes of the memory cell. The erasing voltage is provided to place the memory cell in the high resistance state.

The reading operation consists in determining in what resistance state is found the memory cell. To do so, a reading voltage is applied between the electrodes of the memory cell so as to determine the resistance value of the memory cell. Next, the resistance value of the memory cell is compared with a first resistance threshold called "reading resistance threshold". If the resistance value of the memory cell is lower than the reading resistance threshold, the memory cell is considered as being in the low resistance state. Conversely, if the resistance value of the memory cell is greater than the reading resistance threshold, the memory cell is considered as being in the high resistance state.

The programming method 200 comprises a step of programming 210 one or more memory cells. The programming step 210 may be a writing step 210a, an erasing step 210b or a combination of any number and any order of these two steps 210a, 210b.

Figure 3A:
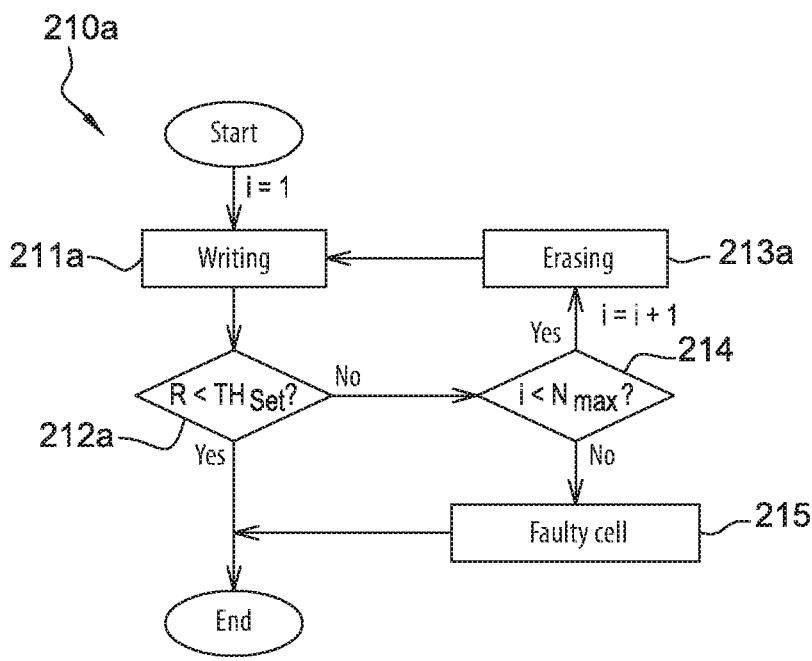
FIG. 3A is a logic diagram of a writing step of the programming method of FIG. 2.

FIG. 3A shows an example of logic diagram of the step of writing 210a a memory cell. The writing step 210a comprises a first operation of writing 211a the memory cell. This is a first attempt to place the memory cell in the low resistance state. However, it is not certain that this attempt ends up with the desired result. Indeed, after the writing operation 211a, it is possible that the memory cell is not actually placed in the low resistance state.

The writing operation 211a is thus followed by a reading operation 212a to verify if the memory cell is actually in the low resistance state. This is a particular reading operation, called "writing verification operation", which is carried out during the writing step 210a. During the writing verification operation 212a, the resistance value R of the memory cell is compared with a second resistance threshold called "writing resistance threshold" $TH_{Set}$.

If the resistance value R of the memory cell is lower than the writing resistance threshold $TH_{Set}$, the memory cell is considered as being in the low resistance state, which signifies that the writing operation 211a has succeeded. In this case, the writing step 210a is finished.

Conversely, if the resistance value R of the memory cell is not lower than the writing resistance threshold $TH_{Set}$, the memory cell is not considered as being in the low resistance state, which signifies that the writing operation 211a has failed.

In the latter case, an operation of erasing 213a the memory cell is beneficially performed before carrying out a new attempt to write 211a the memory cell. It is in fact known that by carrying out a complete programming cycle, that is to say a writing operation and an erasing operation, the probability of reaching the desired resistance state, in this particular instance the low resistance state, is increased.

Figure 3B:
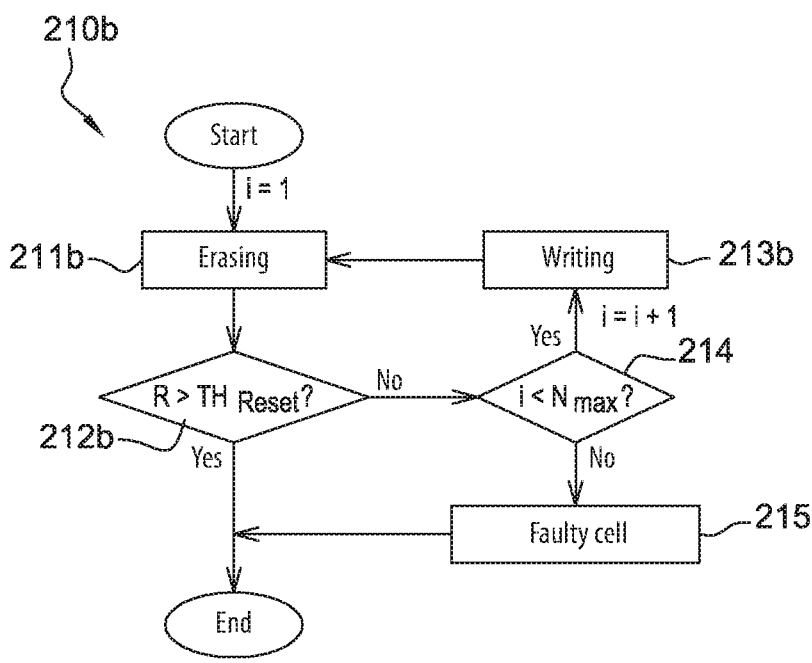
FIG. 3B is a logic diagram of an erasing step of the programming method of FIG. 2.

FIG. 3B shows an example of logic diagram of the step of erasing 210b a memory cell. The sequencing of the erasing step 210b is similar to that of the writing step 210a. The erasing step 210b comprises a first operation of erasing 211b the memory cell. This is a first attempt to place the memory cell in the high resistance state. However, it is not certain that this attempt ends up in the desired result. Indeed, after the erasing operation 211b, it is possible that the memory cell is not actually placed in the high resistance state.

The erasing operation 211b is thus followed by a reading operation 212b to verify if the memory cell is actually in the high resistance state. This is a particular reading operation, called "erasing verification operation", which is carried out during the erasing step 210b. During the erasing verification operation 212b, the resistance value R of the memory cell is compared with a third resistance threshold called "erasing resistance threshold" $TH_{Reset}$.

If the resistance value R of the memory cell is greater than the erasing resistance threshold $TH_{Reset}$, the memory cell is considered as being in the high resistance state, which signifies that the erasing operation 211b has succeeded. In this case, the erasing step 210b is finished.

Conversely, if the resistance value R of the memory cell is not greater than the erasing resistance threshold $TH_{Reset}$, the memory cell is not considered as being in the high resistance state, which signifies that the erasing operation 211b has failed.

In the latter case, an operation of writing 213b the memory cell is beneficially performed before carrying out a new attempt to erase 211b the memory cell. One thus proceeds for the same reason as in the writing step 201a, that is to say to increase the probability of reaching the desired resistance state, in this particular instance the high resistance state.

Beneficially, the programming step 210, whether it is a writing step 210a or an erasing step 210b, also comprises a step of comparison 214 between the number i of attempts already carried out to programme the memory cell and a predetermined maximum number $N_{max}$ of attempts. The comparison step 214 is for example carried out between each programming attempt 211a, 211b and the corresponding opposite programming operation 213a, 213b. The maximum number $N_{max}$ of attempts is for example equal to 5.

If the number i of attempts carried out is strictly lower than the maximum number $N_{max}$ of attempts (i<$N_{max}$), the number i of attempts carried out is incremented and the programming step 210 continues. In the opposite case, the memory cell is declared faulty during a step 215 and the programming step 210 ends. The programming step 210 may then be started again on another memory cell.

In the embodiment illustrated in FIG. 2, the reading, writing and erasing resistance thresholds are identical and are indifferently designated "reference threshold" in the remainder of the description.

The programming method 200 beneficially comprises a step of initialisation 290 of the resistive memory. After their manufacture, the memory cells are in a virgin state characterised by a high resistance. The memory cells are thus initially in the high resistance state. During the initialisation step 290, the switching zone of the memory cells is formed for the first time, the memory cells then switching to the low resistance state. To do so, a forming voltage is applied between the electrodes of the memory cells. The forming voltage is greater than the writing voltage. The memory cells may next enter into a normal operating mode in which the writing voltage and the erasing voltage are used to switch over the resistance state.

Beneficially, the initialisation step 290 also comprises a phase of conditioning the memory cells making it possible to stabilise the switching zone. The conditioning phase consists for example in repeating a certain number of programming cycles each comprising a writing operation and an erasing operation, these programming cycles being carried out on all of the memory cells. The conditioning phase comprises for example a hundred or so programming cycles.

The programming method 200 also comprises a step of determining 230 the optimal resistance threshold $TH_{opt}$ to minimise programming errors, that is to say minimise the number of attempts required to programme the memory cells correctly. The programming time is thereby reduced. This also comes down to minimising the number of memory cells declared faulty during the programming step 210.

The step of determining 230 the resistance threshold is repeated regularly to adjust the resistance threshold as a function of the ageing of the resistive memory. A time interval between each iteration of the determination step 230 is thus defined. This time interval corresponds for example to a predetermined number $N_C$ of programming cycles. In other words, when at least one memory cell has been programmed this number $N_C$ of times, the step of determining 230 the resistance threshold is once again triggered. This number $N_C$ may depend on the technology of the memory cells. For example, for a memory cell of which the dielectric material is hafnium oxide ($HfO_2$) arranged between two electrodes made of titanium nitride (TiN), the number of cycles $N_C$ is chosen equal to $10^4$, which corresponds to the number of cycles after which the variability of the resistance values begins to increase.

In this case, a counter C is implemented to monitor the number of times that the memory cells are programmed. The programming method 200 then comprises a step of comparison 250 between the counter C and the predetermined number $N_C$ of programming cycles, such as illustrated in FIG. 2. The programming method 200 further comprises a step of resetting 270 the counter C to zero, carried out after the step of determining 230 the resistance threshold.

In an alternative embodiment, the time interval between two successive iterations of the determination step 230 can decrease during the lifetime of the resistive memory. In other words, as the resistive memory ages, the determination step 230 is carried out more and more often.

Figure 4:
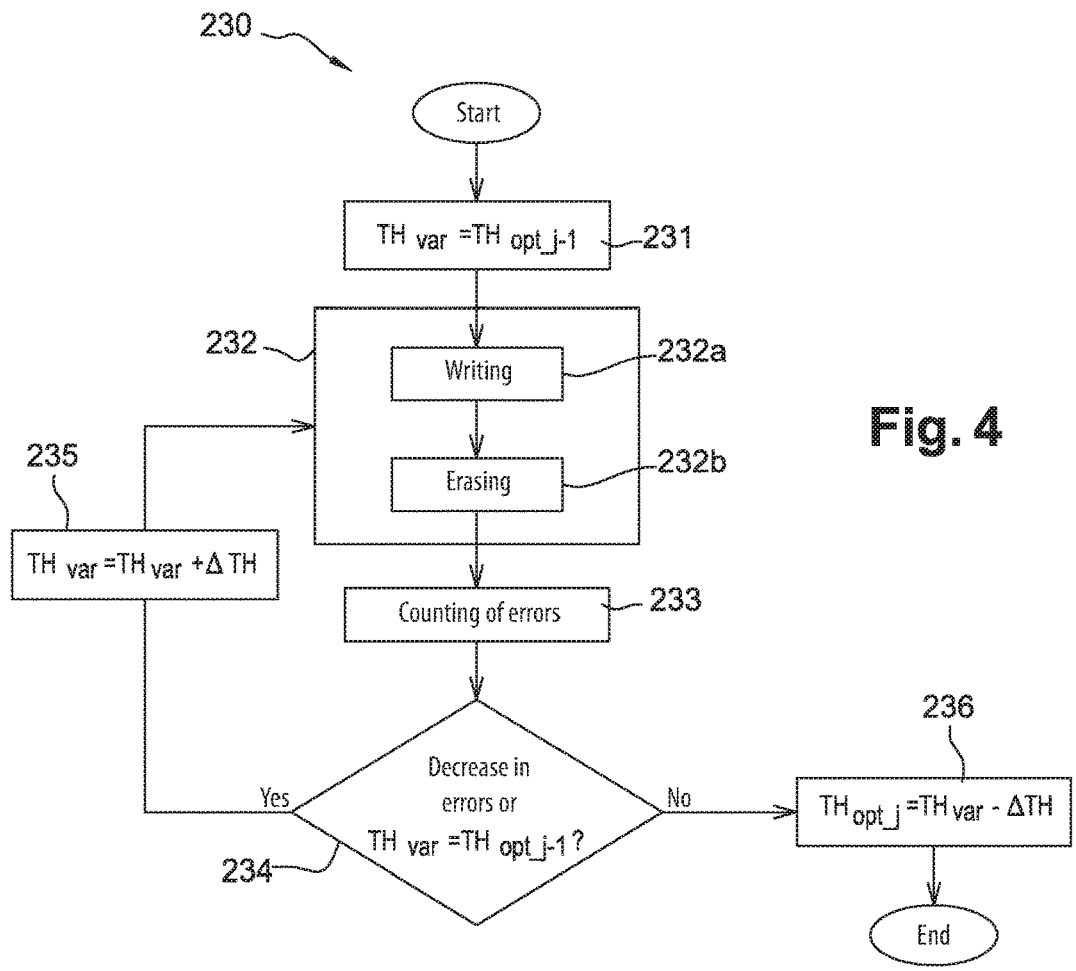
FIG. 4 is a logic diagram of a step of determining a resistance threshold of the programming method of FIG. 2.

FIG. 4 shows an example of logic diagram of the step of determining 230 the optimal resistance threshold $TH_{opt\_j}$ during an iteration j.

The determination step 230 comprises a first step 231 during which a variable resistance threshold $TH_{var}$ is defined equal to the optimal resistance threshold $TH_{opt\_j-i}$ determined during the preceding iteration of the determination step 230. Beneficially, an initial optimal resistance threshold $TH_0$ may be predetermined. The latter may depend on the technology of the memory cells and is obtained for example by characterising the memory cells.

A specific programming step 232 is next performed comprising a first step of writing 232a a first group of memory cells and a second step of erasing 232b a second group of memory cells. Beneficially, in the specific programming step 232, the memory cells are programmed by proceeding in a manner similar to what is done in the programming step 210 described with reference to FIGS. 3A and 3B. However, in this case, the resistance value of the memory cells is compared with the variable resistance threshold $TH_{var}$.

The determination step 230 also comprises a step of counting 233 the total number of programming errors arising during the specific programming step 232, that is to say the number of memory cells that have not been placed in the appropriate resistance state. In this particular instance, this comes down to counting the number of memory cells declared faulty during the specific programming step 232.

Next, during a fourth step 234, it is examined if the variable resistance threshold $TH_{var}$ is still equal to the optimal resistance threshold $TH_{opt\_j-i}$. If such is the case, this signifies that the specific programming step 232 that has just been carried out is the first. In this case, at least one second specific programming step 232 is performed after having modified the variable resistance threshold $TH_{var}$ during a fifth step 235.

The sense of variation of the variable resistance threshold depends on the technology of the memory cells and may thus be predetermined. For example, for memory cells of which the electrodes are made of titanium nitride (TiN) and the dielectric material is made of hafnium oxide ($HfO_2$), the optimal resistance threshold $TH_{opt}$ increases with the ageing of the memory cells. In this case, the variable resistance threshold $TH_{var}$ is incremented by a predefined resistance pitch $\Delta TH$.

During the fourth step 234, it is also examined if the number of programming errors arising during the last specific programming step 232 has decreased with respect to the number of programming errors arising during the preceding specific programming step 232. If such is the case, this signifies that the variable resistance threshold $TH_{var}$ is not the optimal resistance threshold $TH_{opt\_j}$. In this case, the variable resistance threshold $TH_{var}$ is once again modified and a new specific programming step 232 is carried out.

If none of the two conditions mentioned previously is verified, that is to say if the variable resistance threshold $TH_{var}$ is different from the optimal resistance threshold $TH_{opt\_j-i}$ and if the number of programming errors has not decreased, this signifies that the variable resistance threshold $TH_{var}$ during the preceding specific programming step 232 was the optimal resistance threshold $TH_{opt\_j}$. In this case, during a sixth step 236, the optimal resistance threshold $TH_{opt\_j}$ is defined equal to the current variable resistance threshold $TH_{var}$ from which the resistance pitch $\Delta TH$ is subtracted.

The first group of memory cells and the second group of memory cells each comprise a sufficient number of memory cells to make it possible to determine the optimal resistance threshold $TH_{opt}$ correctly. In other words, the first and second groups are defined so as each to form a sample representative of the behaviour of all of the memory cells. As an example, for each set of $10^6$ memory cells, each group may comprise $4 \cdot 10^3$ memory cells. The first group and the second group may be formed by the same memory cells.

Figure 5:
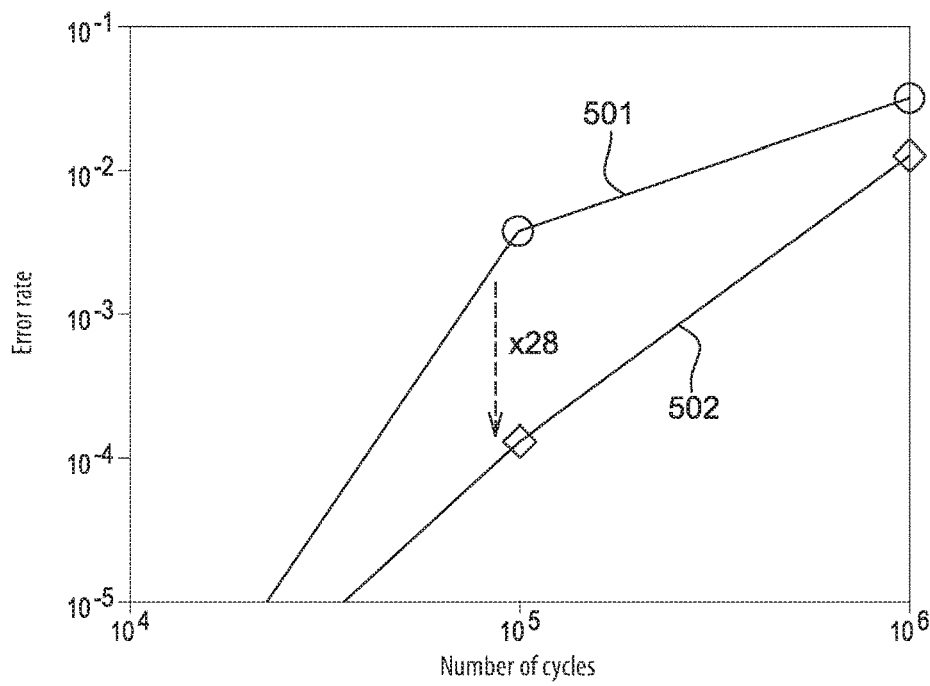
FIG. 5 represents two curves of variation in the rate of programming errors as a function of the number of programming cycles of a resistive memory programmed according to a method of the prior art and according to the method of FIG. 2.

FIG. 5 shows two curves 501, 502 representing the variation in the rate of programming errors as a function of the number of programming cycles of a resistive memory of $TiN/HfO_2/TiN$ type. The first curve 501 corresponds to a programming method of the prior art in which the reading, writing and erasing resistance thresholds are fixed and are respectively equal to 12 k$\Omega$, 10 k$\Omega$ and 14 k$\Omega$. The second curve 502 corresponds to the programming method of the invention. In this case, a single resistance threshold is used initially equal to 12 k$\Omega$ and which is next adjusted periodically. In this example, the resistance pitch $\Delta TH$ is equal to 2 k$\Omega$ and the resistance threshold increases until reaching 36 k$\Omega$. It is noted that an embodiment of the invention indeed makes it possible to reduce the error rate, here up to a factor 28.

In an alternative embodiment, the optimal resistance threshold $TH_{opt}$ determined during the determination step 230 may be the reading resistance threshold $TH_{Read}$. In this case, the writing resistance threshold $TH_{Set}$ and the erasing resistance threshold $TH_{Reset}$ may be defined with respect to the reading resistance threshold $TH_{Read}$ such that:

$$TH_{Set} < TH_{Read} < TH_{Reset}$$

One benefit is to ensure a wider programming window, that is to say a greater difference between the low resistance state and the high resistance state. In other words, the conditions on the resistance value applied during the programming are more severe. Thus, it is possible to compensate the drift over time of the resistance value so that the memory cell remains in the correct programming state during the reading operation. For example, the writing resistance threshold $TH_{Set}$ and the erasing resistance threshold $TH_{Reset}$ are respectively defined equal to 90% and to 110% of the reading resistance threshold $TH_{Read}$.

It will be appreciated that the invention is not limited to the embodiments described with reference to the figures and alternatives could be envisaged without going beyond the scope of the invention.

The invention claimed is:

1. A method for programming a non-volatile resistive memory comprising a plurality of non-volatile resistive memory cells, each memory cell being able to switch in a reversible manner between:
   a first programming state corresponding to a low resistance state, in which the memory cell has an electrical resistance value lower than a first resistance threshold; and
   a second programming state corresponding to a high resistance state, in which the memory cell has an electrical resistance value greater than the first resistance threshold;
the programming method comprising determining the first resistance threshold carried out periodically, the determining comprising:
   a first writing step for placing a first group of memory cells in the low resistance state, a first number of memory cells of the first group not actually being placed in the low resistance state after the first programming step, said first number of memory cells being considered, after the first writing step, in the high resistance state associated with the first resistance threshold; and
   a second erasing step for placing a second group of memory cells in the high resistance state, a second number of memory cells of the second group not actually being placed in the high resistance state after the second programming step, said second number of memory cells being considered, after the second erasing step, in the low resistance state associated with the first resistance threshold;
the first resistance threshold being determined so as to minimise a number of programming errors equal to a sum of the first number of memory cells and the second number of memory cells.

2. The programming method according to claim 1, wherein the determining of the first resistance threshold comprises:
   a) defining a variable resistance threshold equal to the first resistance threshold determined during a preceding determination step;
   b) carrying out the first writing step and the second erasing step using the variable resistance threshold;
   c) determining the number of programming errors arising during step b);
   d) repeating steps b) and c) after having modified the variable resistance threshold according to a predetermined sense of variation, steps b) and c) being repeated at least once and as long as the number of programming errors decreases between two consecutive steps b);
   e) defining the first resistance threshold equal to the variable resistance threshold used during the penultimate step b).

3. The programming method according to claim 1, wherein two consecutive steps of determining the first resistance threshold are separated by a time interval corresponding to a first predetermined number of programming cycles that at least one memory cell has undergone.

4. The programming method according to claim 1, further comprising a programming step comprising at least one of:
   a writing step for placing at least one memory cell in the low resistance state, said at least one memory cell being considered as being in the low resistance state at the end of the writing step if the resistance value of said at least one memory cell is lower than a second resistance threshold lower than or equal to the first resistance threshold;
   an erasing step for placing at least one memory cell in the high resistance state, said at least one memory cell being considered as being in the high resistance state at the end of the erasing step if the resistance value of said at least one memory cell is greater than a third resistance threshold greater than or equal to the first resistance threshold;
the second resistance threshold and the third resistance threshold being defined as a function of the determined first resistance threshold.

5. The programming method according to claim 4, wherein the second resistance threshold and the third resistance threshold are equal to the first resistance threshold.

6. The programming method according to claim 4, wherein the second resistance threshold and the third resistance threshold are respectively equal to 90% and to 110% of the first resistance threshold.

7. The programming method according to claim 1, wherein each memory cell comprises a dielectric material arranged between two electrodes, the memory cell passing from the high resistance state to the low resistance state when a switching zone is formed in the dielectric material, the switching zone electrically connecting the electrodes of the memory cell, the programming method further comprising a step of initialisation of the resistive memory comprising:
   forming for the first time the switching zone of each memory cell; and
   conditioning the memory cells by repeating a second predetermined number of programming cycles each comprising an operation of writing and an operation of erasing the memory cells.

8. The programming method according to claim 1, wherein the memory cells are of CBRAM or OxRAM type.

* * * * *